United States Patent [19]

Mendez et al.

[11] Patent Number: 5,079,774
[45] Date of Patent: Jan. 7, 1992

[54] POLARIZATION-TUNABLE OPTOELECTRONIC DEVICES

[75] Inventors: Emilio E. Mendez, Croton-on-Hudson, N.Y.; Doyeol Ahn, Seoul, Rep. of Korea

[73] Assignee: International Business Machines Corporation, Armonk, N.Y.

[21] Appl. No.: 634,647

[22] Filed: Dec. 27, 1990

[51] Int. Cl.$^5$ ............................................. H01S 3/19
[52] U.S. Cl. ........................................ 372/27; 372/45
[58] Field of Search ................ 372/45, 46, 27, 8; 357/16, 17

[56] References Cited

U.S. PATENT DOCUMENTS

| | | | |
|---|---|---|---|
| 3,301,625 | 1/1967 | Ashkin et al. | 350/150 |
| 4,207,122 | 6/1980 | Goodman | 148/33.4 |
| 4,430,740 | 2/1984 | Nuyen et al. | 372/45 |
| 4,498,179 | 2/1985 | Wayne et al. | 372/27 |
| 4,509,173 | 4/1985 | Umeda et al. | 372/50 |
| 4,546,480 | 10/1985 | Burnham et al. | 372/45 |
| 4,549,300 | 10/1985 | Mitsuhashi et al. | 372/50 |
| 4,612,645 | 9/1986 | Liu et al. | 372/45 |
| 4,644,553 | 2/1987 | Van Ruyven et al. | 372/45 |
| 4,685,108 | 8/1987 | Seymour et al. | 372/8 |
| 5,012,474 | 4/1991 | White et al. | 372/27 |

Primary Examiner—James W. Davie
Attorney, Agent, or Firm—Perman & Green

[57] ABSTRACT

A strained-layer quantum well (QW) or multi-quantum well (MQW) semiconductor laser device (10) having a polarization that is switchable between the TE and the TM modes by an electric field that is externally applied, via an electrode (22) perpendicularly to the layer (16) or layers of the quantum well. The polarization switching is a direct consequence of a valence-band reversal induced by the electric field in the strained-layer quantum well. An inversion population is maintained during the switching process, resulting in rapid switching times.

27 Claims, 3 Drawing Sheets

POLARIZATION-TUNABLE OPTOELECTRONIC DEVICES

FIELD OF THE INVENTION

This invention relates generally to optoelectronic devices and, in particular, to optoelectronic devices, such as laser diodes, wherein the polarization of output radiation is switchable between a TM mode and a TE mode by an electric field that is externally applied perpendicularly to a strained quantum well.

BACKGROUND OF THE INVENTION

In U.S. Pat. No. 4,612,645, issued Sept. 16, 1986, entitled "Fast Polarization-Switchable Semiconductor Lasers" Jia-Ming Liu and Ying-Chih Chen disclose a laser device that includes a semiconductor substrate, a first cladding layer of semiconductor formed on the substrate, and an active layer of semiconductor formed on the first cladding layer for forming a junction plane between the active layer and the first cladding layer. A second cladding layer of semiconductor is formed on the active layer and a cap layer of semiconductor formed on the second cladding layer. The active layer has a lattice constant parallel to the junction plane that is sufficiently larger than the lattice constant normal to the junction plane so as to increase the optical gain of the TM mode. As a result, at a first injection current level the laser device operates in the TM mode and at a second injection current level the laser device operates in the TE mode.

In U.S. Pat. No. 4,549,300, issued Oct. 22, 1985, entitled "Semiconductor Laser Device" Mitsuhashi et al. disclose a semiconductor laser device said to effect quick switching between two polarized outputs. An antireflection coating is provided on opposite end faces and an optical system is provided for returning emitted light back into the same end face. The optical system includes an element for controlling the plane of polarization of the returned light.

In U.S. Pat. No. 4,644,553, issued Feb. 17, 1987 entitled "Semiconductor Laser with Lateral Injection" Van Ruyven et al. disclose a semiconductor device wherein an active region is bounded laterally by semiconductor regions of opposite conductivity type for laterally injecting charge carriers into an active region. The technique is said to be effective in lasers of the quantum well type.

In U.S. Pat. No. 3,301,625, issued Jan. 31, 1967, entitled "Semiconductor Light Modulators", A. Ashkin et al. disclose a light modulator wherein a depletion region of a semiconductor device is modulated for changing the characteristics of light passing through the device.

The following U.S. Patents all relate generally to laser devices. In U.S. Pat. No. 4,509,173, issued Apr. 2, 1985, entitled "Phase-Locked Semiconductor Laser Device" Umeda et al. disclose a phase-locked semiconductor laser device that is furnished locally in the vicinity of an active layer with a parallel or a meshed structure in the travelling direction of the beam. In U.S. Pat. 4,498,179, issued Feb. 5, 1985, entitled "Modulated Infrared Laser with Two Coupled Cavities" Wayne et al. disclose a gas laser having a pair of coupled laser cavities, one of the cavities being a main resonant cavity and the other including polarization coupler. In U.S. Pat. No. 4,430,740, issued Feb. 7, 1984, entitled "Long-Wavelength Semiconductor Laser" Nuyen et al. describe a number of embodiments of a semiconductor laser wherein the material constituting an active layer corresponds to the general formula: $(Ga_xAl_{1-x})_{0.47}In_{0.53}As$, with $0<x<0.27$. In U.S. Pat. No. 4,207,122, issued June 10, 1980, entitled "Infra-Red Light Emissive Devices" Goodman discloses IR light emissive devices having an active region comprised of In(Sb,As) having a lattice spacing matched with GaSb.

What is not taught by this prior art, and what is thus an object of the invention to provide, is a strained-layer quantum-well semiconductor laser device having a polarization of output radiation that is switchable between the Transverse Electric (TE) and the Transverse Magnetic (TM) modes by an electric field that is externally applied perpendicularly to the layer or layers of the quantum well.

The device of Jia-Ming Liu and Ying-Chih Chen that was described previously achieves polarization switching through a change in injection current. As a result, a corresponding change in a device inversion population must also occur. However, the change in the inversion population requires some finite amount of time, thereby placing a lower limit on switching time.

It is therefore another object of the invention to provide for polarization switching through the agency of an externally applied electric field, thereby beneficially maintaining a device inversion population during the switching process to achieve extremely fast switching times.

SUMMARY OF THE INVENTION

The objects of the invention are realized by a strained-layer quantum well (QW) or multi-quantum well (MQW) semiconductor laser device whose polarization is switchable between the TE and the TM modes by an electric field that is externally applied perpendicularly to the layer or layers of the quantum well. The polarization switching is a direct consequence of a valence-band reversal induced by the electric field in the strained-layer quantum well. An inversion population is maintained during the switching process, resulting in extremely fast switching times.

That is, the invention teaches a semiconductor optoelectronic device that includes a first semiconductor material and a quantum well region formed within the first semiconductor material. The quantum well region is comprised of a second semiconductor material having a lattice constant that differs from a lattice constant of the first semiconductor material by an amount sufficient to strain the quantum well region. The strained quantum well operates such that electromagnetic radiation generated within the quantum well region has a TM polarization, the radiation being generated through the recombination of charge carriers injected from a p-n junction. The device further includes an electrode for impressing an electric field across the quantum well region. The electric field is generated to have a magnitude that exceeds a critical magnitude such that electromagnetic radiation generated within the quantum well region has, during a time that the electric field is impressed across the region, a TE polarization. As a result, rapid switching between the TM and TE modes is achieved.

In one illustrative embodiment the first semiconductor material is comprised of AlAsSb, specifically $AlAs_{1-x}Sb_x$, where $x \gtrsim 0.02$, and the second semiconductor material is comprised of GaAs. For this embodiment the difference between the lattice constant of the first semiconductor material and the lattice constant of the second semiconductor material is at least approximately 0.3% In another embodiment the first semiconductor material is comprised of $Ga_{1-x}Al_xSb$, where $x \gtrsim 0.6$, and the second semiconductor material is comprised of GaSb. In a further embodiment the first material is comprised of $Ga_xIn_{1-x}As$, where $0.9 \gtrsim x \gtrsim 0.55$, and the second semiconductor material is comprised of InP.

BRIEF DESCRIPTION OF THE DRAWING

The above set forth and other features of the invention are made more apparent in the ensuing Detailed Description of the Invention when read in conjunction with the attached Drawing, wherein.

DETAILED DESCRIPTION OF THE INVENTION

Before describing in detail the construction and operation of the optoelectronic device of the invention a discussion is first made of the underlying physical mechanisms through which the rapid change in output polarization are achieved.

Figure 1A:
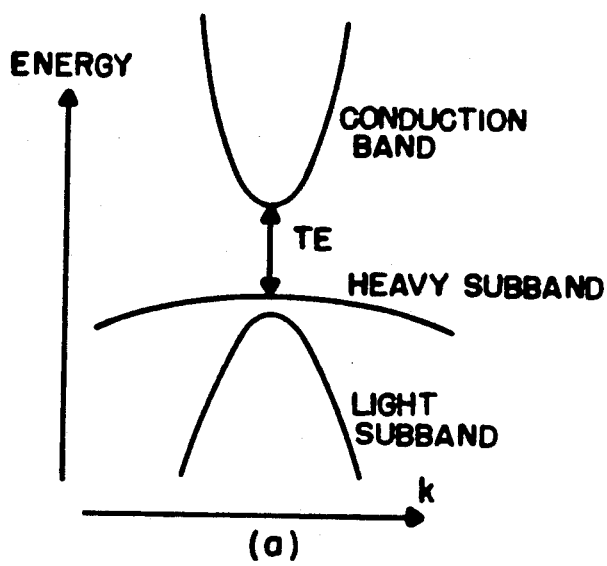
FIGS. 1a, 1b and 1c graphically depict the first heavy-hole and light-hole subbands for a quantum well relative to a conduction band, wherein for FIG. 1a the energies are shown without stress and in the absence of an electric field, for FIG. 1b under stress but in the absence of an electric field, and in FIG. 1c under stress and with an electric field of significant magnitude applied across the quantum well.
Figure 1B:
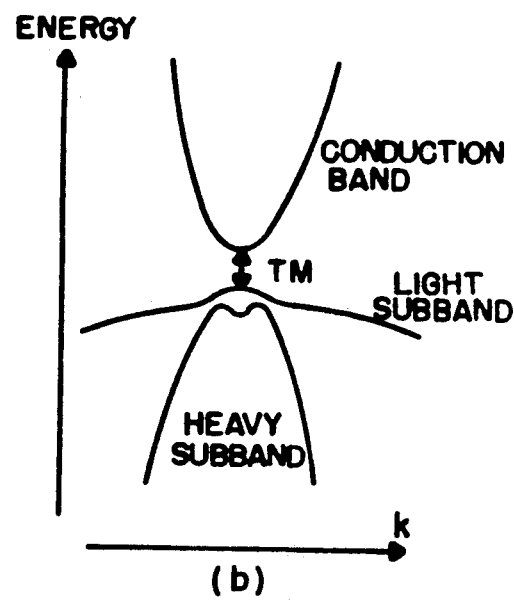
Figure 1C:
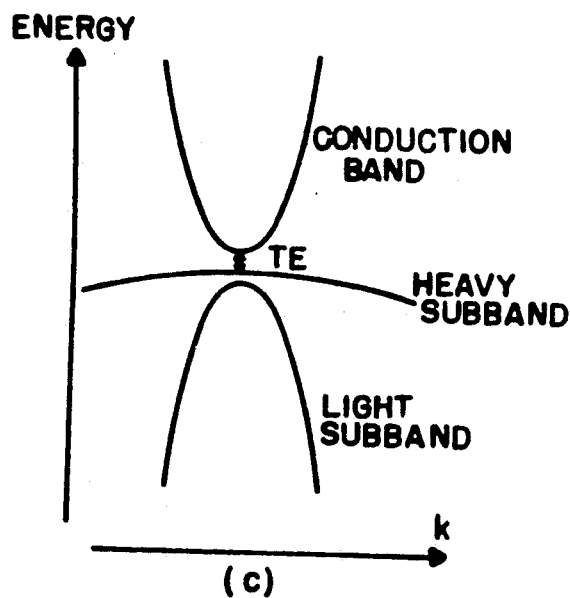

Referring to FIGS. 1a-1c, in the vicinity of the fundamental band gap the valence-band structure of bulk III-V semiconductor compounds consists of two bands. The two bands are spin-degenerate for a zero wavevector ($k=0$) and have effective masses termed "heavy" and "light", respectively. By example, for GaAs a heavy mass is considered to be on the order of approximately one half of the free electron mass while the light mass is considered to be on the order of approximately one tenth of the free electron mass. Other material systems exhibit heavy and light masses of the same order. In quantum wells fabricated of these materials the $k=0$ degeneracy is broken by the quantum-size effect, with the energies of the heavy-mass band normally being greater than those of the light-mass band, as depicted in FIG. 1a. With this band alignment, the fundamental optical transition in such a quantum well occurs between the conduction band and the heavy valence band. Electromagnetic radiation emitted by radiative recombination of electron and holes propagating in the quantum well plane is linearly polarized, with the electric field parallel to the quantum well interfaces (TE polarization).

However, when the quantum well is subject to compressive uniaxial stress along the (001) crystallographic direction both the light and heavy subbands are found to be shifted to higher energies. Significantly, the shift is larger for the light subband than for the heavy subband. Thus, if the compressive stress is made sufficiently large it can reverse the original band ordering, as seen in FIG. 1b, and beyond a critical stress ($S_c$) the fundamental optical transition takes place between the conduction band and the light valence band. In this case, the electric field of electromagnetic radiation propagating in the quantum well plane is polarized perpendicularly to the quantum well interfaces (TM polarization).

As is described below the foregoing physical principles are exploited to provide a quantum-well semiconductor laser device operable to switch an output radiation polarization from TM to TE through the agency of an externally applied electric field.

The laser device includes a strained-layer quantum well in which the stress is compressive and has a magnitude that exceeds the critical value $S_c$. In the absence of a DC electric field the output radiation is polarized in the TM mode, as depicted in FIG. 1b. However, and in accordance with the invention, an external DC electric field, applied perpendicularly to the plane of the quantum well interface, has been found to shift the heavy-hole subband and the light-hole subband to higher energies, in accordance with the Stark effect. In that this shift is larger for heavy holes than for light holes, their relative separation decreases with increasing electric field magnitude. As seen in FIG. 1c, beyond a critical electrical field threshold magnitude the heavy-hole band lies higher in energy than the light-hole band and the polarization of the emitted radiation is abruptly switched from the TM mode to the TE mode. Thus, with an electric field magnitude above the critical magnitude the separation between the heavy subband and the light subband is effectively placed in the unstressed condition shown in FIG. 1a, with a corresponding restoration of the TE mode of output radiation propagation.

As can be realized, an important material requirement to implement this type of operation is the provision of a compressive stress in a quantum well, the compressive stress having a magnitude in excess of $S_c$.

Figure 2A:
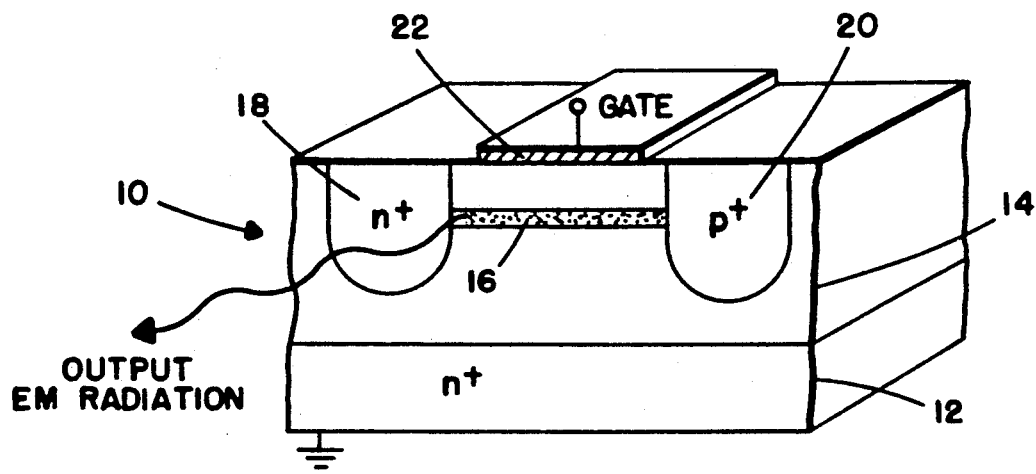
FIG. 2a shows in cross-section a magnified view, not to scale, of one embodiment of a strained-layer QW laser diode constructed and operated in accordance with the invention.

Referring to FIG. 2a there is shown a first embodiment of a quantum well semiconductor laser device 10 constructed and operated in accordance with the invention. An n+ GaAs substrate 12 is provided with a typical thickness of approximately 100 micrometers. Upon the substrate 12 is grown, by example, an epitaxial undoped (intrinsic) $AlAs_{1-x}Sb_x$, where $x \gtrsim 0.02$, barrier and buffer layer 14 to a total thickness of approximately one micrometer. Epitaxial growth may be accomplished via conventional deposition techniques such as Molecular Beam Epitaxy (MBE) and Metal-organic Chemical Vapor Deposition (MOCVD).

During the growing of the layer 14 the growth process is interrupted after approximately 2000 Angstroms of the layer 14 is deposited and a relatively thin (100 Angstroms) GaAs quantum well 16 is formed. The quantum well 16 is strained by having a lattice constant smaller than that of the underlying layer 14. The magnitude of $S_c$ is a function of the quantum well 16 width. For typical widths, of the order of 100 Angstroms, $S_c$ is of the order of 4kbar, corresponding to a lattice mismatch of approximately 0.3% for x≃0.02.

Instead of a quantum well 16 having a single GaAs layer the quantum well 16 may also be fabricated as a MQW region having a plurality of alternating layers comprised of GaAs/AlAs$_{1-x}$Sb$_x$, where x≳0.02, each layer having a thickness of approximately 100 Angstroms. The MQW structure achieves the same compressively strained configuration due to the lattice mismatch between the two MQW materials.

After fabrication of the quantum well 16 a further one micrometer of AlAs$_{1-x}$Sb$_x$, where x≳0.02, is epitaxially grown. An n+ diffusion region 18 is formed as is a p+ diffusion region 20. Regions 18 and 20 may also be formed by ion implantation of a suitable dopant species. The regions 18 and 20 have a depth of approximately 4000 Angstroms from the top surface and laterally bound the quantum well 16 for injecting, when forward biased, charge carriers therein. The spacing between regions 18 and 20 is approximately 50 microns to 100 microns. A conductive electrode 22 is formed by conventional means upon the top surface for applying an electric field in a perpendicular fashion to the quantum well 16. The electric field is developed between the electrode 22 and the substrate 12, the substrate 12 typically being coupled to a common potential during operation. The electrode 22 functions in a manner similar to that of a gate for a conventional field effect transistor (FET), wherein a potential applied to the gate modulates device operation. However, whereas in a conventional FET current flow is modulated, in the optoelectronic device of the invention the applied "gate" potential switches the polarization of output radiation between the TM and TE modes.

Figure 2B:
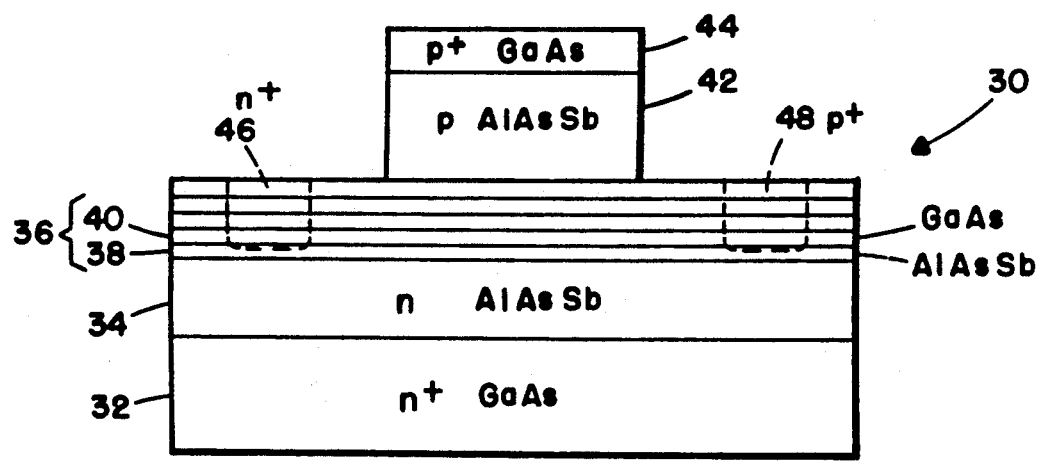
FIG. 2b shows in cross-section a magnified view, not to scale, of another embodiment of a strained-layer QW laser diode constructed and operated in accordance with the invention.

Referring now to FIG. 2b there is shown an alternative method of applying an electrical field to the active quantum well region. Specifically, the device 30 incorporates a vertical p-n junction formed between a p+ GaAs contact layer 44 and an n+ GaAs substrate 32. This vertical p-n junction is reversed biased during operation to provide an electric field of sufficient magnitude to switch the polarization of the output radiation.

In greater detail, the device 30 includes the n+ GaAs substrate 32 having a thickness of approximately 100 micrometers. Overlying substrate 32 is an n-type AlAsSb buffer layer 34 having a thickness of approximately one micrometer. Overlying the buffer layer 34 is an active quantum well region 36 that is comprised of a plurality of thin layers 38 and 40, each having a thickness of 100 Angstroms. Layers 38 are comprised of undoped (intrinsic) AlAsSb and layers 40 are comprised of undoped GaAs. Overlying the quantum well region 36 is a p-type layer of AlAsSb having a thickness of approximately one micrometer. The layers 34 and 42 function as cladding layers for the interposed active quantum well region and serve to confine, in a conventional manner, the radiation generated therein. Overlying layer 42 is the p+ GaAs contact layer 44. An n+ diffusion 46 and a p+ diffusion 48 define a horizontal p-n junction that serves to inject charge carriers, when forward biased, into the active region.

As in the embodiment of FIG. 2a, the composition of the various materials are chosen such that at least a 0.3% difference in lattice constant results in the quantum well region 36 being strained such that radiation generated therein has a TM polarization. In this regard, the AlAsSb has the composition AlAs$_{1-x}$Sb$_x$, where x≳0.02. The reverse bias potential applied between the substrate 32 and contact 44 has a magnitude selected to generate an electric field having a magnitude that exceeds the critical value.

Figure 2C:
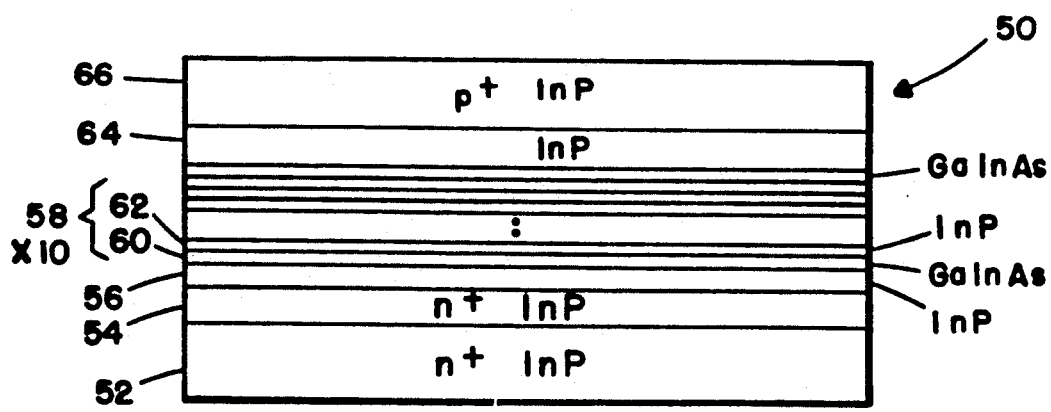
FIG. 2c shows in cross-section a magnified view, not to scale, of a further embodiment of a strained-layer QW laser diode constructed and operated in accordance with the invention.

Referring to FIG. 2c there is shown a further embodiment of the invention. A device 50 is provided with an n+ InP substrate 52 having a thickness of approximately 100 micrometers. Overlying the substrate 52 is an n+ InP buffer layer 54. Overlying buffer layer 54 is a thinner layer 56 (0.1 micrometers) that is comprised of intrinsic InP. Overlying layer 56 is a quantum well region 58 comprised of, by example, 10 layers 60 and 62 each having a thickness of approximately 100 Angstroms. The layers 60 are comprised of Ga$_x$In$_{1-x}$As, where 0.9≳x≳0.55, while the layers 62 are comprised of InP. The composition of the GaInAs is selected to provide at least an approximately 0.3% difference in lattice constant between the layers 60 and 62, thereby generating the required strain (S$_c$) within the quantum well region 58. Overlying the quantum well region 58 is an intrinsic InP layer 64 having a thickness of approximately 0.1 micrometers. The InP layers 56 and 64 function as cladding layers for confining the radiation generated within the quantum well region. An overlying contact layer 66 is comprised of p+ InP. The lateral forward biased p-n junction formed by n+ and p+ diffusions is not shown in the device 50. A reverse bias potential applied between the substrate 52 and the contact layer 66 is provided with a magnitude sufficient to generate an electric field strength that exceeds the critical value for switching the polarization of the output radiation from the TM mode to the TE mode. A typical electric field strength is of the order of 100 kV/cm, which is readily achievable with reverse biases of a few volts. The exact voltage required is a function of the number of quantum well layers within the device.

An example of another material system that satisfies the criterion of providing a value of S$_c$ of the order of 4kbar, corresponding to a lattice mismatch of approximately 0.3%, includes, but is not limited to, GaSb/Ga$_{1-x}$Al$_x$Sb, where x≳0.6.

In general, any other material combinations may be employed such that the material acting as a quatum well is subjected to a uniaxial compressive stress in excess of S$_c$ to provide embodiments similar to those of FIGS. 2a-2c.

These alternate material systems may also be prepared epitaxially via conventional deposition techniques such as MBE and MOCVD.

Figure 3A:
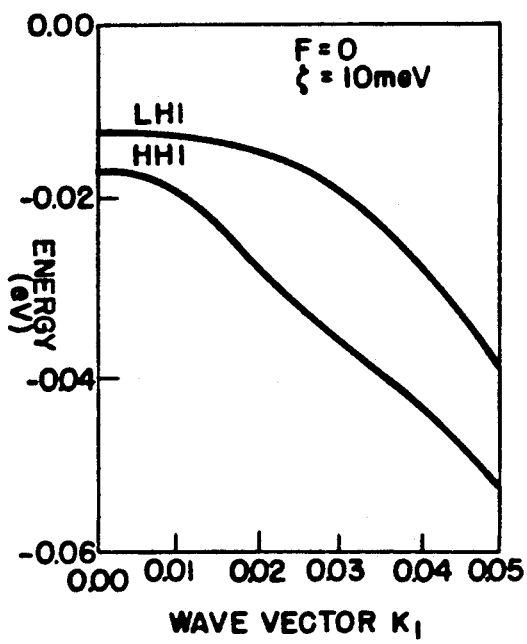
FIGS. 3a, 3b and 3c are valence band energy dispersion diagrams for a GaAs QW under 10meV strain potential (4kbar) at an electric field magnitude of zero (FIG. 3a), 75kV/cm (FIG. 3b) and 100kV/cm (FIG. 3c).
Figure 3B:
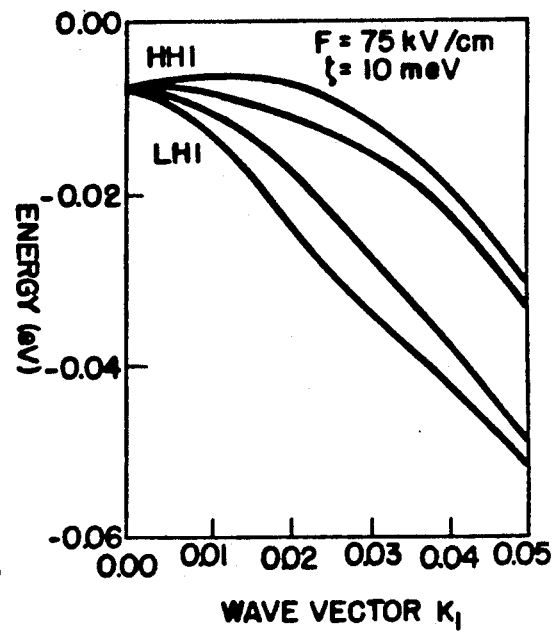
Figure 3C:
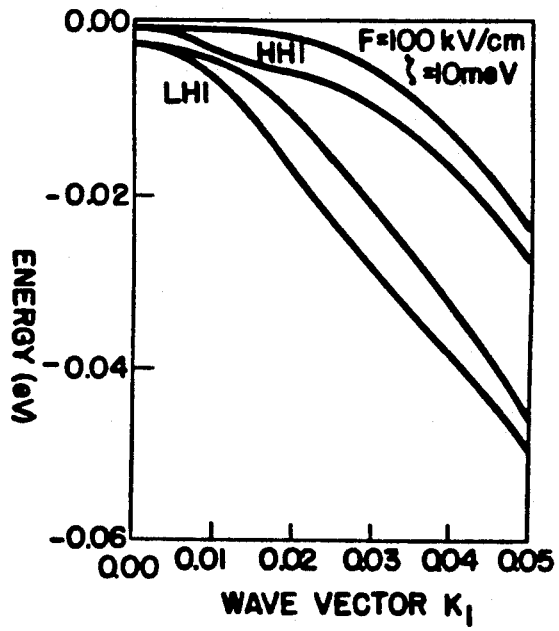

As a quantitative example, a calculated valence band structure for a 100 Angstroms thick GaAs quantum well 16, under a 10meV strain potential resulting from the relatively thick surrounding AlAs$_{1-x}$Sb$_x$ (x≳0.02) layer 14, is shown in FIGS. 3a-3c. At an electric field strength of zero (FIG. 3a) the highest-lying band (LH1) has a light mass (~0.08 m$_O$, where m$_O$ is the free-electron mass) in the direction of quantization (001), although in the plane of the quantum well 16 the mass is heavier. In contrast, the second-highest lying band (HH2) has a heavy mass along (001), although its mass perpendicular to (001) is light.

An application of an electric field causes the distance to decrease between the two bands at k=0. At 75kV/cm the two bands can be seen, in FIG. 3b, to be degenerate. Above this field "HH" is higher in energy, as shown in FIG. 3(c), for the band-edge energies as a function of electric field strength. This calculation, which takes into account the complexities of the GaAs valence bands, confirms the qualitative description presented above. In addition, these graphs show that the required stresses and electric field strengths are moderate and readily obtainable with existing fabrication methodologies. Furthermore, the change in polarization is accomplished without a change in injection current or a corresponding change in the device inversion population. As such, the required change in the inversion population required by the prior art is avoided, resulting in high speed switching operation that is limited mainly by the RC time constant of the device.

The ability to rapidly switch polarization between the TM and the TE modes makes the optoelectronic device of the invention especially useful for data communication equipment and, in combination with polarization-sensitive photodetectors, of significant use in optical digital applications.

Although described above in the context of Group III-V material systems the teaching of the invention is also applicable to other materials such as Group IV and Group II-VI materials wherein a lattice mismatch between adjacent layers of materials provide a quantum well region with a compressive strain sufficient to cause output radiation to be emitted with a TM polarization. As such, while the invention has been particularly shown and described with respect to several embodiments thereof, it will be understood by those skilled in the art that changes in form and details may be made therein without departing from the scope and spirit of the invention.

Having thus described our invention, what we claim as new, and desire to secure by Letters Patent is:

1. A semiconductor optoelectronic device comprising:
   a quantum well region comprised of a first semiconductor material and a second semiconductor material, the second semiconductor material having a lattice constant that differs from a lattice constant of the first semiconductor material by an amount sufficient to strain the quantum well region such that electromagnetic radiation generated within the quantum well region has a TM polarization; and
   means for impressing an electric field across the quantum well region, the electric field having a magnitude above a threshold magnitude such that electromagnetic radiation generated within the quantum well region has, during a time that the electric field is impressed there across, a TE polarization.

2. A semiconductor optoelectronic device as set forth in claim 1 wherein the first semiconductor material is comprised of AlAsSb and wherein the second semiconductor material is comprised of GaAs.

3. A semiconductor optoelectronic device as set forth in claim 1 wherein the first semiconductor material is comprised of $AlAs_{1-x}Sb_x$, where $x \gtrsim 0.02$, and wherein the second semiconductor material is comprised of GaAs.

4. A semiconductor optoelectronic device as set forth in claim 1 wherein the first semiconductor material is comprised of GaAlSb and wherein the second semiconductor material is comprised of GaSb.

5. A semiconductor optoelectronic device as set forth in claim 1 wherein the first semiconductor material is comprised of $Ga_{1-x}Al_xSb$, where $x \gtrsim 0.06$, and wherein the second semiconductor material is comprised of GaSb.

6. A semiconductor optoelectronic device as set forth in claim 1 wherein the first semiconductor material is comprised of GaInAs and wherein the second semiconductor material is comprised of InP.

7. A semiconductor optoelectronic device as set forth in claim 1 wherein the first semiconductor material is comprised of $Ga_xIn_{1-x}As$, where $0.9 \gtrsim x \gtrsim 0.55$, and wherein the second semiconductor material is comprised of InP.

8. A semiconductor optoelectronic device as set forth in claim 1 wherein the difference between the lattice constant of the first semiconductor material and the lattice constant of the second semiconductor material is at least approximately 0.3%.

9. A semiconductor optoelectronic device as set forth in claim 1 and further including a substrate that underlies the quantum well region.

10. A semiconductor optoelectronic device as set forth in claim 9 wherein the substrate is comprised of GaAs or of InP.

11. A semiconductor optoelectronic device as set forth in claim 1 wherein the first semiconductor material has a thickness of approximately one micrometer and wherein the second semiconductor material has a thickness of approximately 100 Angstroms.

12. A semiconductor optoelectronic device as set forth in claim 1 and further comprising a p-n junction disposed for injecting charge carriers into the quantum well region.

13. A semiconductor optoelectronic device as set forth in claim 1 wherein the impressing means is comprised of an electrode means disposed for impressing the electric field in a perpendicular manner to a plane or planes of the quantum well region.

14. A semiconductor optoelectronic device as set forth in claim 1 wherein the impressing means is comprised of a p-n junction disposed for impressing the electric field in a perpendicular manner to a plane or planes of the quantum well region.

15. A semiconductor optoelectronic device as set forth in claim 1 wherein the quantum well region is comprised of a plurality of layers of the second semiconductor material, and wherein individual ones of a pair of the layers have a layer comprised of the first semiconductor material interposed therebetween.

16. A semiconductor optoelectronic device as set forth in claim 1 wherein the threshold magnitude is sufficient to cause, within the quantum well region, a heavy-hole band to have a higher energy than a light-hole band for switching the polarization of the electromagnetic radiation from the TM polarization mode to the TE polarization mode.

17. A semiconductor laser comprising:
   a substrate;
   a first semiconductor material disposed above a surface of the substrate;
   a quantum well region formed adjacent to the first semiconductor material, the quantum well region being comprised of at least one layer of a second semiconductor material that has a lattice constant that differs from a lattice constant of the first semiconductor material by an amount sufficient to compressively strain the quantum well region such that electromagnetic radiation generated within the quantum well region has a TM polarization; and
   means for impressing an electric field perpendicularly across the at least one layer of the quantum well region, the electric field having a magnitude sufficient for switching the polarization of the electromagnetic radiation from the TM polarization to a TE polarization.

18. A semiconductor laser as set forth in claim 17 wherein the first semiconductor material is comprised of AlAsSb, and wherein the second semiconductor material is comprised of GaAs.

19. A semiconductor laser as set forth in claim 17 wherein the first semiconductor material is comprised of GaAlSb and wherein the second semiconductor material is comprised of GaSb.

20. A semiconductor laser as set forth in claim 17 wherein the first semiconductor material is comprised of InP and wherein the second semiconductor material is comprised of GaInAs.

21. A semiconductor laser as set forth in claim 17 wherein the lattice constant of the first semiconductor material differs from the lattice constant of the second semiconductor material by at least approximately 0.3%.

22. A semiconductor laser as set forth in claim 17 and further comprising a p-n junction disposed for injecting charge carriers laterally into the layer or layers of the quantum well region.

23. A semiconductor laser as set forth in claim 17 wherein the impressing means is comprised of an electrode disposed for impressing the electric field perpendicularly across the layer or layers of the quantum well region.

24. A semiconductor laser as set forth in claim 17 wherein the impressing means is comprised of a p-n junction disposed for impressing the electric field perpendicularly across the layer or layers of the quantum well region.

25. A semiconductor laser as set forth in claim 17 wherein the quantum well region is comprised of a plurality of layers including layers comprised of the first semiconductor material and layers comprised of the second semiconductor material, wherein the second semiconductor material is selected from the group consisting of GaAs, GaSb, and $Ga_xIn_{1-x}As$ ($0.9 \gtrsim x \gtrsim 0.55$).

26. A semiconductor laser as set forth in claim 17 wherein the quantum well region is comprised of a plurality of layers including layers comprised of the first semiconductor material and layers comprised of the second semiconductor material, wherein the first semiconductor material is selected from the group consisting of $AlAs_{1-x}Sb_x$ ($x \gtrsim 0.02$), $Ga_{1-x}Sb$, where $x \gtrsim 0.6$, and InP.

27. A method of operating a semiconductor laser comprising the steps of:
   providing a semiconductor laser having one or more quantum wells, the one or more quantum wells having a uniaxial compressive stress applied thereto, a magnitude of the compressive stress being in excess of a critical value ($S_c$);
   operating the semiconductor laser to generate electromagnetic radiation having a TM polarization; and
   applying an electric field perpendicularly to the one or more quantum wells, the electric field having a magnitude above a threshold magnitude for causing the semiconductor laser to generate electromagnetic radiation having a TE polarization.

* * * * *